(12) United States Patent
Mahajan et al.

(10) Patent No.: US 9,741,581 B2
(45) Date of Patent: Aug. 22, 2017

(54) USING TENSILE MASK TO MINIMIZE BUCKLING IN SUBSTRATE

(71) Applicant: GLOBALFOUNDRIES INC., Grand Cayman (KY)

(72) Inventors: Sunit S. Mahajan, Halfmoon, NY (US); Parul Dhagat, Halfmoon, NY (US); Anne C. Friedman, Fishkill, NY (US); Timothy A. Brunner, Ridgefield, CT (US); Shahrukh A. Khan, Danbury, CT (US)

(73) Assignee: GLOBALFOUNDRIES INC., Grand Cayman (KY)

( * ) Notice: Subject to any disclaimer, the term of this patent is extended or adjusted under 35 U.S.C. 154(b) by 0 days.

(21) Appl. No.: 14/992,391

(22) Filed: Jan. 11, 2016

(65) Prior Publication Data
US 2017/0200614 A1    Jul. 13, 2017

(51) Int. Cl.
*H01L 29/06* (2006.01)
*H01L 21/308* (2006.01)
*H01L 21/306* (2006.01)
*H01L 21/8234* (2006.01)
*H01L 27/088* (2006.01)

(52) U.S. Cl.
CPC ...... *H01L 21/3081* (2013.01); *H01L 21/3086* (2013.01); *H01L 21/30604* (2013.01); *H01L 21/823431* (2013.01); *H01L 27/0886* (2013.01); *H01L 29/0657* (2013.01)

(58) Field of Classification Search
None
See application file for complete search history.

(56) References Cited

U.S. PATENT DOCUMENTS

| | | | |
|---|---|---|---|
| 7,160,811 B2 * | 1/2007 | Chen | H01L 21/31111 257/E21.251 |
| 7,547,646 B2 * | 6/2009 | Bernhardt | H01L 21/3081 438/775 |
| 2005/0130358 A1 * | 6/2005 | Chidambarrao | H01L 21/823807 438/197 |
| 2005/0255656 A1 * | 11/2005 | Kang | H01L 21/8221 438/283 |
| 2005/0277254 A1 * | 12/2005 | Ha | H01L 29/66621 438/259 |
| 2009/0026523 A1 * | 1/2009 | Wong | H01L 21/845 257/316 |
| 2010/0260992 A1 * | 10/2010 | Chen | H01L 21/0214 428/213 |
| 2011/0241040 A1 * | 10/2011 | Yu | H01L 21/76877 257/91 |

(Continued)

*Primary Examiner* — Sitaramarao S Yechuri
(74) *Attorney, Agent, or Firm* — Yuanmin Cai; Hoffman Warnick LLC

(57) ABSTRACT

A method for preventing buckling in a substrate using a tensile hard mask is provided. The method may include forming a mask over a substrate, the hard mask including a first area having a pattern for forming a plurality of openings and an adjacent second area free of openings, and the hard mask includes a tensile stress therein. The hard mask may be used to form the plurality of openings in the substrate. Partially eroding the hard mask leaves the substrate with the plurality of openings therein and a substantially planar surface, having diminished buckling.

13 Claims, 4 Drawing Sheets

(56) References Cited

U.S. PATENT DOCUMENTS

| | | | |
|---|---|---|---|
| 2014/0264352 A1* | 9/2014 | Lee | H01L 29/66833 257/66 |
| 2014/0264931 A1* | 9/2014 | Wang | H01L 23/53295 257/774 |
| 2015/0076607 A1* | 3/2015 | Alptekin | H01L 29/785 257/365 |
| 2015/0371902 A1* | 12/2015 | Sakai | H01L 21/78 257/620 |
| 2016/0104705 A1* | 4/2016 | Chung | H01L 27/0886 257/347 |
| 2016/0322479 A1* | 11/2016 | Liu | H01L 29/66977 |

* cited by examiner

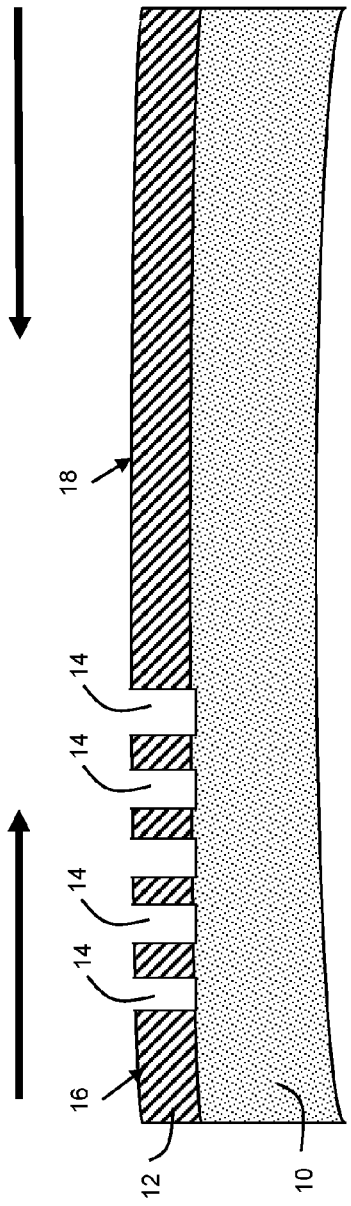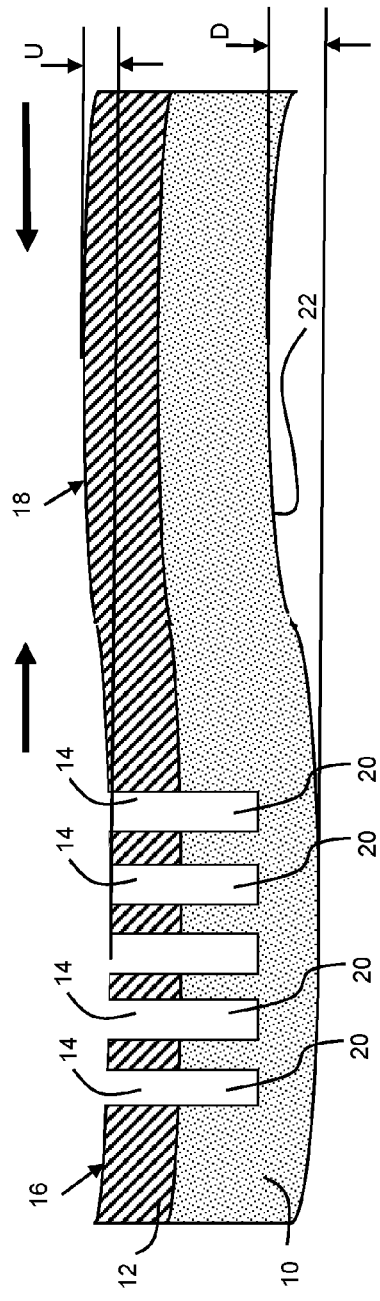

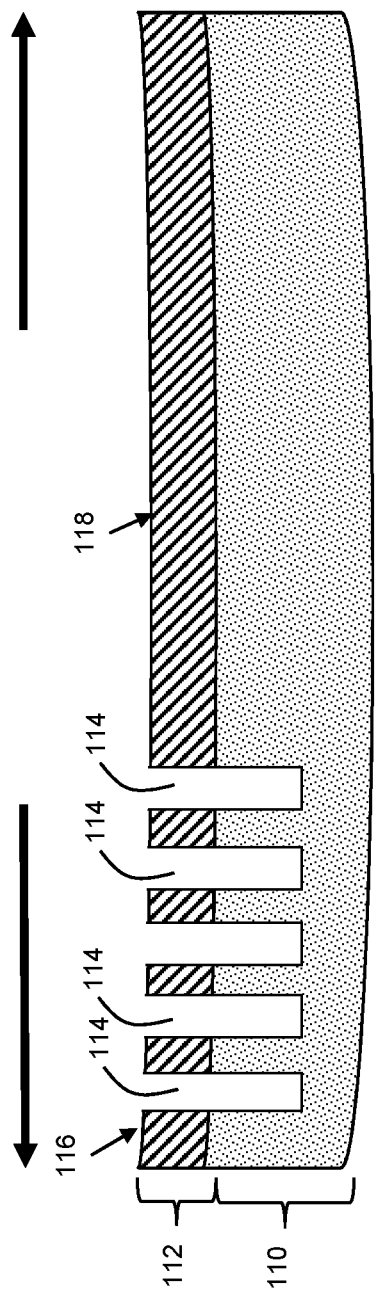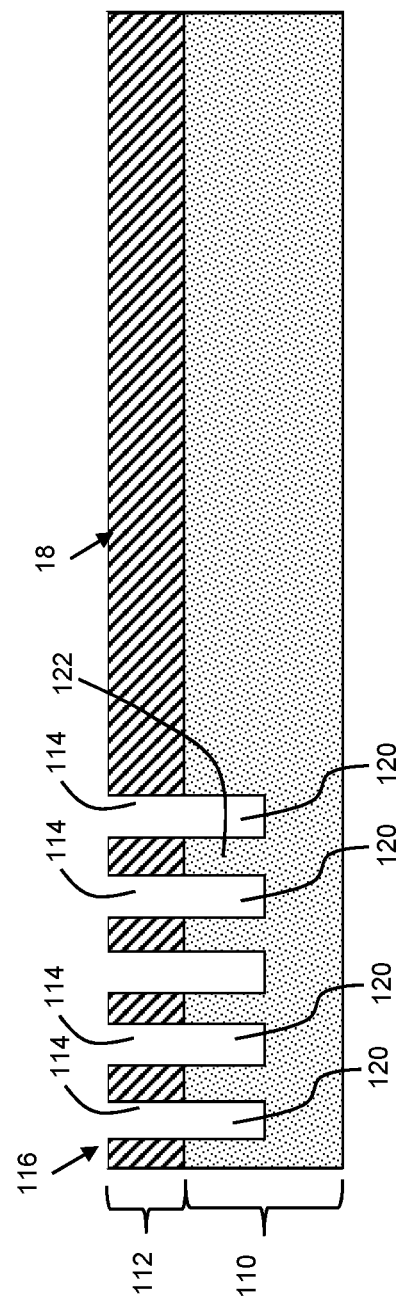

USING TENSILE MASK TO MINIMIZE BUCKLING IN SUBSTRATE

BACKGROUND

Technical Field

The present disclosure relates to semiconductor fabrication, and more specifically, to a method using a tensile hard mask to minimize buckling in a substrate, and the resulting intermediate semiconductor structure.

Related Art

In integrated circuit devices, groups of openings are formed in semiconductor substrates for use in forming a wide variety of structures such as capacitors, memory, fins, etc. One type of opening that is typically formed in groups in one area of the semiconductor substrate but not in other areas includes deep trenches. Groups of openings can be formed using any conventional process such as patterning a thick oxide mask over the semiconductor substrate, etching the pattern into the substrate in one area, and fully or partially removing the mask. After the openings are formed, the surface topography (or relief) of the area with the openings is typically lower compared to those areas without openings. Subsequent operations have difficulty with the resulting, uneven topography. For example, subsequent alignment and planarizing operations cannot effectively correct for the distortion, leading to variable structure positions and heights. One example structure that has different heights over the openings, e.g., trenches, compared to where no openings are provided include fin-gate structures. The height difference can be, for example, 60-70 nanometers, which is 3-4 times greater than presently acceptable tolerances. Consequently, the varied surface topography severely limits device yield.

SUMMARY

A first aspect of the disclosure is directed to a method, comprising: forming a hard mask over a substrate, the hard mask including a first area having a pattern for forming a plurality of openings, wherein the hard mask includes a tensile stress therein; using the hard mask to form the plurality of openings in the substrate; and partially eroding the hard mask, leaving the substrate with the plurality of openings therein and a substantially planar surface.

A second aspect of the disclosure includes a method, comprising: forming a hard mask over a substrate, the hard mask including a first area having a pattern for forming a plurality of deep trenches, wherein the hard mask includes a tensile stress therein; using the hard mask to form the plurality of deep trenches in the substrate; and partially eroding the hard mask, leaving the substrate with the plurality of openings therein and a substantially planar upper surface.

A third aspect of the disclosure related to a semiconductor structure, comprising: a substrate having a plurality of openings therein in a first area and an adjacent second area free of openings, wherein the substrate is substantially planar on a surface opposing both the first area and the adjacent second area.

The foregoing and other features of the disclosure will be apparent from the following more particular description of embodiments of the disclosure.

BRIEF DESCRIPTION OF THE DRAWINGS

The embodiments of this disclosure will be described in detail, with reference to the following figures, wherein like designations denote like elements, and wherein:

FIG. 1 shows a cross-sectional view of a conventional mask over a substrate.

FIG. 2 shows a cross-sectional view of a conventional mask and substrate after etching openings into the substrate.

FIG. 4 shows a cross-sectional view of a tensile hard mask over a substrate according to embodiments of the disclosure.

FIG. 5 shows a cross-sectional view of the hard mask and substrate of FIG. 4 after etching openings into the substrate according to embodiments of the disclosure.

Figure 3:
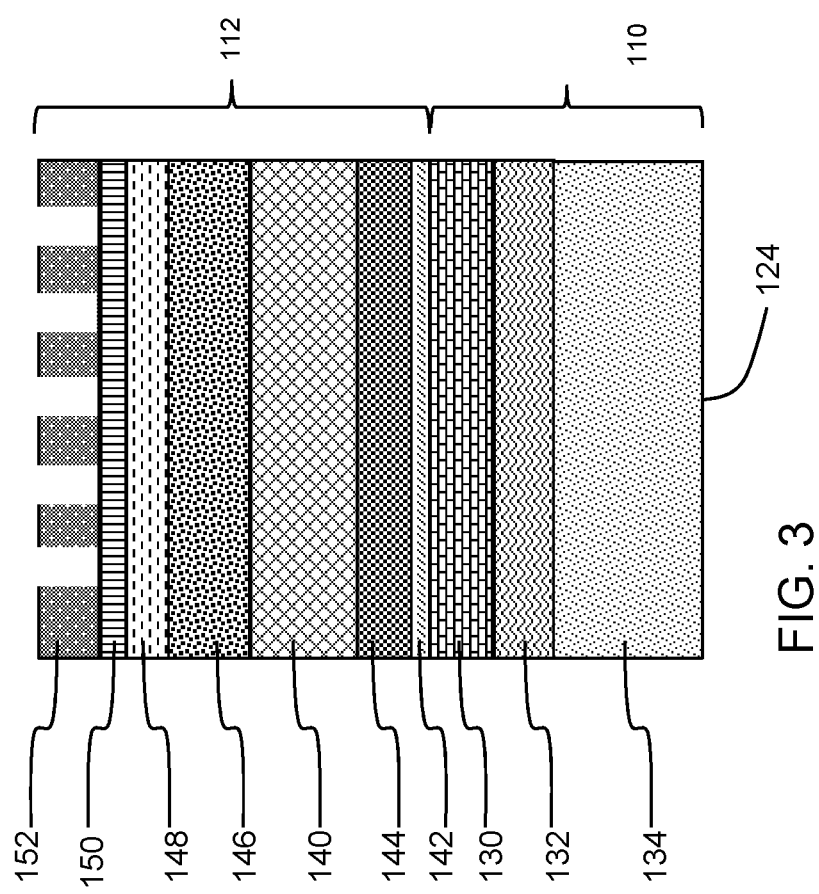
FIG. 3 shows a cross-sectional and exploded view of a tensile hard mask over a substrate according to embodiments of the disclosure.

It is emphasized that the drawings are not to scale.

DETAILED DESCRIPTION

Embodiments of the disclosure employ a method to prevent buckling in a substrate from a plurality of openings being formed therein using a hard mask including a tensile stress. It has been discovered that surface topography variation is caused by elastic deformation of the substrate surface due to stress resulting from the openings, as for example due to annealing after deposition. To illustrate, FIG. 1 shows a substrate 10 having a mask 12 patterned 14 thereover for forming a plurality of openings 20 (FIG. 2) in one area 16 but not in another area 18. As indicated by arrows, mask 12 applies a compressive stress on substrate 10. FIG. 2 shows substrate 10 after etching of openings 20 into substrate 10. An examination of the deformation pattern shows that it has the characteristics of a nonlinearly-deformed (buckled) surface, with raised area(s) (see dimension U) where no openings 20 are provided (area 18) adjacent to low areas that include openings 20 (area 16). A nonlinearly-deformed surface is also observed in an opposing surface 22 of substrate 10 as indicated by dimension D. The buckling is due to relaxation immediately after the perforation stages of opening formation, before any fill, due to the decrease in top surface effective modulus of the penetrated areas 16 relative to those areas 18 not patterned. More specifically, mask 12 that is used to form the deep trenches is conventionally compressive. Mask 12 may be formed using, for example, plasma enhanced chemical vapor deposited (PECVD) oxide typically deposited at 400° C. resulting in a mask 12 having a compressive stress in the range of approximately −200 to approximately −80 MegaPascals (MPa). Thus, when openings 20, such as deep trenches, are created, material that would normally resist the compression is removed. When mask 12 is removed, the materials may buckle further and a generally lower surface profile results where openings 20 exist (the surface profile where openings 20 do not exist may also rise). When openings 20 are subsequently filled (not shown), the fill makes uneven topography permanent.

According to embodiments of the disclosure, the effective stress of a plate surface of a substrate is varied in order to control its relaxation buckling in shear and to influence the resulting surface topography. In accordance with embodiments of the disclosure, the stress acting on the plate modulus is controlled by using a tensile hard mask to minimize or eliminate buckling after perforation. The modulus can also be varied in a number of additional ways such as by: material selection, local thickness variation, alloying; and perforation pattern and depth variation, inclusions, thermal treatments or gradients, and/or electronic or piezoelectric means. Also, slightly compressive films (less compressive than conventionally used) may also be of use if the inward stress does not exceed the surface buckling threshold. Particular immediate applications are envisioned to apply to very large scale semiconductor integrated circuit (VLSI) formation with deep trenches, and can be extended to wafers or plates with general surface openings made through an overlying layer.

Figure 6:
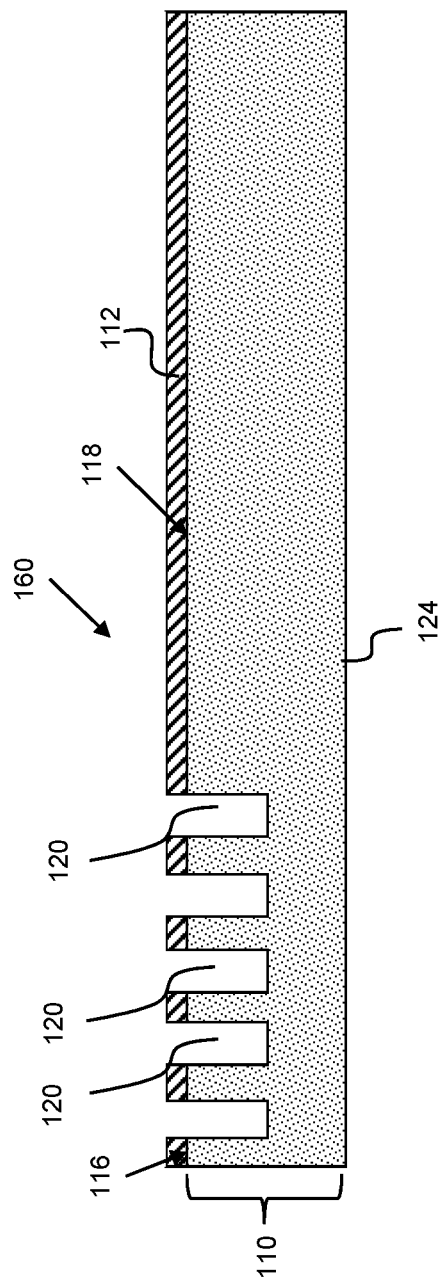
FIG. 6 shows a cross-sectional view of the substrate after removing the hard mask, and a semiconductor structure, according to embodiments of the disclosure.

Referring to FIGS. 3-6, embodiments of the disclosure will now be described. FIG. 3 shows a cross-sectional view of an illustrative substrate 110 with a hard mask 112 shown in a detailed or exploded manner. FIGS. 4-6 show cross-sectional views of an illustrative substrate 110 with hard mask 112 shown in a simplified manner. In one embodiment, substrate 110 may include but is not limited to silicon, germanium, silicon germanium, silicon carbide, and those consisting essentially of one or more III-V compound semiconductors having a composition defined by the formula $Al_{X1}Ga_{X2}In_{X3}As_{Y1}P_{Y2}N_{Y3}Sb_{Y4}$, where X1, X2, X3, Y1, Y2, Y3, and Y4 represent relative proportions, each greater than or equal to zero and X1+X2+X3+Y1+Y2+Y3+Y4=1 (1 being the total relative mole quantity). Other suitable substrates include II-VI compound semiconductors having a composition $Zn_{A1}Cd_{A2}Se_{B1}Te_{B2}$, where A1, A2, B1, and B2 are relative proportions each greater than or equal to zero and A1+A2+B1+B2=1 (1 being a total mole quantity). Substrate 110 may also have a semiconductor-on-insulator (SOI) form. For example, as shown in FIG. 3, where substrate 110 includes an SOI substrate, SOI layer 130 may have a thickness of, for example, approximately 360 Angstroms (Å), with a buried insulator layer 132 thereunder of approximately 1900 Å, and an underlying bulk or epitaxial substrate 134 of approximately 780 nm. As used herein, "approximately" may indicate +/−10% of the amount or lower and upper amount stated, as the case may be. Alternatively, substrate 110 may take the form of practically any material upon which patterned openings (e.g., via photolithographic techniques) are used to form openings within substrate 110.

FIGS. 3-4 also show forming hard mask 112 over substrate 110. In the drawings, a nitride edge ring is omitted for clarity. As shown in FIGS. 4-6, hard mask 112 may be formed including a first area 116 having a pattern 114 for forming a plurality of openings 120 (FIG. 5) and an adjacent second area 118 free of openings. In accordance with aspects of the disclosure, in contrast to conventional hard masks, hard mask 112 includes a stress (indicated by arrows in FIG. 4) provided by a stress layer 140 therein. Stress layer 140 may include a tensile stress, or may simply include a compressive stress that is less compressive than conventional mask 12 (FIGS. 1-2). In terms of tensile stress, hard mask 112 may provide a tensile stress in the range of approximately 100-400 MegaPascals (MPa).

Hard mask 112 may also include a plurality of other layers including, for example: a pad oxide layer 142, a re-oxidized pad nitride layer 144, an amorphous carbon layer 146, a low temperature oxide (LTO) layer 148, an organic planarizing layer 150 and a photoresist layer 152 (shown patterned). Approximate thicknesses of the above-listed layers may be, for example: pad oxide layer 142, 23 Å; reoxidized pad nitride layer 144, 1020 Å; an amorphous carbon layer 146, 4670 Å; LTO layer 148, 800Å; and organic planarizing layer 150, 135 Å. It is emphasized, however, the thickness of various layers and, in particular, photoresist layer 152 may vary drastically depending on the structures to be formed using openings 114. In addition, the layers that constitute hard mask 112 may vary depending on application.

Hard mask 112 layers may be deposited using any appropriate "depositing" technique for the material to be deposited including but are not limited to, for example: chemical vapor deposition (CVD), low-pressure CVD (LPCVD), plasma-enhanced CVD (PECVD), semi-atmosphere CVD (SACVD) and high density plasma CVD (HDPCVD), rapid thermal CVD (RTCVD), ultra-high vacuum CVD (UHVCVD), limited reaction processing CVD (LRPCVD), metalorganic CVD (MOCVD), sputtering deposition, ion beam deposition, electron beam deposition, laser assisted deposition, thermal oxidation, thermal nitridation, spin-on methods, physical vapor deposition (PVD), atomic layer deposition (ALD), chemical oxidation, molecular beam epitaxy (MBE), plating, evaporation. Pattern 114 may be formed using any conventional techniques, e.g., applying and patterning a photoresist, etching, etc.

With regard to particular examples of stress layer 140, in one embodiment, stress layer 140 may include an enhanced high aspect ratio oxide process (eHARP®), available from Applied Materials®. This layer may be formed, for example, via SACVD of ozone ($O_3$)/tetraethyl orthosilicate, $Si(OC_2H_5)_4$ (TEOS), and water vapor. This layer exhibits a tensile stress therein of approximately 200 MPa. In another embodiment, stress layer 140 may include an undoped silicon glass (USG). In one example, USG may be formed using any appropriate $O_3$/TEOS ratio, with thermal dissociation at approximately 480° C. This layer exhibits a tensile stress therein of approximately 400 MPa. Other stress layers 140 may provide more or less stress. In another example, stress layer 140 may include a high aspect ratio, chemical vapor deposited (CVD) fill oxide that is less compressive compared to conventional mask 12 (FIGS. 1-2), but is still compressive. In one CVD process for this embodiment, tetraethyl orthosilicate, $Si(OC_2H_5)_4$ (TEOS) may be formed using oxygen and helium. In this case, hard mask 112 may have thickness of approximately 10000 Å and more compressive stress of approximately −120 MPa compared to hard mask 12 (FIGS. 1-2). In any of the above-described embodiments, hard mask 112 may have a thickness of, for example, approximately 1000-1100 nanometers (nm). It is emphasized that while particular embodiments of hard mask 112 and stress layer 140 thereof have been described herein, various other processes and stress layer forms are possible and are considered within the scope of the disclosure.

FIG. 5 shows using hard mask 112 (shown simplified) to form plurality of openings 120 in substrate 110. Openings 120 can be formed using any appropriate etching technique for substrate 110, e.g., for a semiconductor material, reactive ion etching (RIE), wet etching, plasma etching, etc. Openings 120 can take a variety of forms. In one embodiment, openings 120 may include deep trenches such as those used to form capacitors or memory cells, or openings 120 may include elongated trenches so as to form fins 122 (only one labeled) in substrate 110 such as may be used to form fin-type field effect transistors (finFETs). Each opening 120 may have a width (or diameter) in a range of approximately 60-100 nanometers (nm).

FIG. 6 shows partially eroding hard mask 112, leaving substrate 110 with plurality of openings 120 therein and a substantially planar surface 124. Hard mask 112 may be eroded (and later removed) using any now known or later developed mask removal process such as dry or wet etching or chemical-mechanical planarization. In one example, referring to FIG. 3, hard mask 112 may be eroded such that only a portion of stress layer 140 remains with pad layers 142, 144 thereunder. In this example, stress layer 140 may have a thickness of, for example, approximately 9000 Å. As used herein, "substantially planar surface" indicates that edge undulations from a surface 124 opposing area 118 and area 116 (latter, between openings 120) does not exceed a standard deviation of approximately 5-7 nanometers. That is, dimension D in FIG. 2 does not exceed a standard deviation of approximately 5-7 nanometers. The use of hard mask 112 greatly reduces or eliminates the buckling at the free edge and surface variation exhibited by conventional compressive masks. Any now known or later developed subsequent processing can be carried out hereafter, e.g., removing hard mask 112, filling openings 120, etc.

FIG. 6 also shows an embodiment of a semiconductor structure 160 according to embodiments of the disclosure. Structure 160 may include substrate 110 having plurality of openings 120 therein in first area 116 and adjacent second area 118 free of openings. Substrate 110 is substantially planar on a surface 124 opposing both first area 116 and adjacent second area 118, e.g., edge undulations do not exceed approximately 5-7 nanometers. Alternatively, the structure may include, as shown in FIG. 5, mask 112 over substrate 110, where mask 112 includes pattern 114 including a plurality of openings and an adjacent second area 118 free of openings.

The method as described above may be used in the fabrication of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

The descriptions of the various embodiments of the present disclosure have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A method, comprising:
    forming a hard mask over a substrate, the hard mask including a first area having a pattern for forming a plurality of openings, wherein the hard mask includes a tensile stress therein, and wherein the hard mask includes a plurality of layers, one layer of the plurality of layers including an undoped silicon glass (USG) stress layer for providing the tensile stress;
    using the hard mask to form the plurality of openings in the substrate; and
    partially eroding the hard mask, leaving the substrate with the plurality of openings therein and a substantially planar surface.

2. The method of claim 1, wherein the plurality of openings includes a plurality of deep trenches.

3. The method of claim 1, wherein the plurality of openings includes a plurality of trenches, and further comprising forming a plurality of fins in the substrate between pairs of the trenches.

4. The method of claim 1, wherein the tensile stress is approximately 100-400 MegaPascals.

5. The method of claim 1, wherein each opening in the plurality of openings has a width in a range of approximately 60-100 nanometers (nm).

6. The method of claim 1, wherein the hard mask further includes a second area free of openings adjacent to the first area, and wherein the substantially planar surface includes the first area and the second area.

7. A method, comprising:
    forming a hard mask over a substrate, the hard mask including a first area having a pattern for forming a plurality of deep trenches, wherein the hard mask includes a tensile stress therein, and wherein the hard mask includes a plurality of layers, one layer of the plurality of layers including an undoped silicon glass (USG) stress layer for providing the tensile stress;
    using the hard mask to form the plurality of deep trenches in the substrate; and
    partially eroding the hard mask, leaving the substrate with the plurality of deep trenches therein and a substantially planar upper surface.

8. The method of claim 7, further comprising forming a plurality of fins in the substrate between pairs of the trenches.

9. The method of claim 7, wherein the tensile stress is approximately 100-400 MegaPascals.

10. The method of claim 7, wherein the hard mask further includes a second area free of openings adjacent to the first area, and wherein the substantially planar upper surface includes the first area and the second area.

11. A method, comprising:
    forming a hard mask over a substrate, the hard mask including a first area having a pattern for forming a pair of elongate openings, wherein the hard mask includes a plurality of layers, one layer of the plurality of layers including an undoped silicon glass (USG) stress layer for providing a tensile stress;
    forming the pair of elongate openings in the substrate, using the pattern of the hard mask, to define at least one fin on the substrate between the pair of elongate openings; and
    partially eroding the hard mask to a yield a structure including the substrate with the pair of elongate openings, the at least one fin, and a substantially planar surface of the substrate.

12. The method of claim 11, wherein the tensile stress is approximately 100-400 MegaPascals.

13. The method of claim 11, wherein the hard mask further includes a second area free of openings adjacent to the first area, and wherein the second area defines at least a portion of the substantially planar surface.

* * * * *